(12) United States Patent
Zeng et al.

(10) Patent No.: US 11,681,001 B2
(45) Date of Patent: Jun. 20, 2023

(54) DEEP LEARNING METHOD FOR NONSTATIONARY IMAGE ARTIFACT CORRECTION

(71) Applicant: The Board of Trustees of the Leland Stanford Junior University, Palo Alto, CA (US)

(72) Inventors: David Y. Zeng, Stanford, CA (US); Dwight G Nishimura, Palo Alto, CA (US); Shreyas S. Vasanawala, Stanford, CA (US); Joseph Y. Cheng, Los Altos, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 1249 days.

(21) Appl. No.: 15/916,718

(22) Filed: Mar. 9, 2018

(65) Prior Publication Data
US 2019/0277935 A1    Sep. 12, 2019

(51) Int. Cl.
*G01R 33/565* (2006.01)
*G01R 33/48* (2006.01)
*G06T 5/00* (2006.01)
*G06N 5/046* (2023.01)

(52) U.S. Cl.
CPC ... *G01R 33/56545* (2013.01); *G01R 33/4826* (2013.01); *G06N 5/046* (2013.01); *G06T 5/002* (2013.01); *G06T 2207/10088* (2013.01); *G06T 2207/20084* (2013.01)

(58) Field of Classification Search
CPC .......... G01R 33/56545; G01R 33/5608; G01R 33/56536; G01R 33/4826; G06N 5/046; G06N 3/0454; G06N 3/0472; G06N 3/08; G06T 5/002; G06T 2207/10088; G06T 2207/20084
See application file for complete search history.

(56) References Cited

U.S. PATENT DOCUMENTS

| | | | |
|---|---|---|---|
| 6,587,114 | B1 | 7/2003 | Peercy |
| 6,996,241 | B2 | 2/2006 | Ray |
| 7,970,237 | B2 | 6/2011 | Miller |
| 8,321,134 | B2 | 11/2012 | Al-Saleh |
| 8,442,344 | B2 | 5/2013 | Jiang |

(Continued)

OTHER PUBLICATIONS

Wang et al., Reduction of Gibbs Artifacts in Magnetic Resonance Imaging Based on Convolutional Neural Network, 10th International Congress on Image and Signal Processing, BioMedical Engineering and Information, IEEE. (Year: 2017).*

(Continued)

*Primary Examiner* — Walter L Lindsay, Jr.
*Assistant Examiner* — Frederick Wenderoth
(74) *Attorney, Agent, or Firm* — Lumen Patent Firm

(57) ABSTRACT

A method for magnetic resonance imaging corrects non-stationary off-resonance image artifacts. A magnetic resonance imaging (MRI) apparatus performs an imaging acquisition using non-Cartesian trajectories and processes the imaging acquisitions to produce a final image. The processing includes reconstructing a complex-valued image and using a convolutional neural network (CNN) to correct for non-stationary off-resonance artifacts in the image. The CNN is preferably a residual network with multiple residual layers.

12 Claims, 5 Drawing Sheets

(56) References Cited

U.S. PATENT DOCUMENTS

2019/0257905 A1* 8/2019 Cheng ................ G01R 33/5611
2021/0181287 A1* 6/2021 Sommer ............ G01R 33/5608

OTHER PUBLICATIONS

Ahunbay E, Pipe JG. Rapid method for deblurring spiral MR images. Magn Reson Med. 2000;44(3):491-494.

Hopgood et al. Blind single channel deconvolution using nonstationary signal processing. IEEE Transactions on Speech and Audio Processing, 11(5):476488, 2003.

Levin, Y. Weiss, F. Durand, and W. Freeman. Understanding and evaluating blind deconvolution algorithms. 2009 IEEE Conference on Computer Vision and Pattern Recognition, 2009.

* cited by examiner

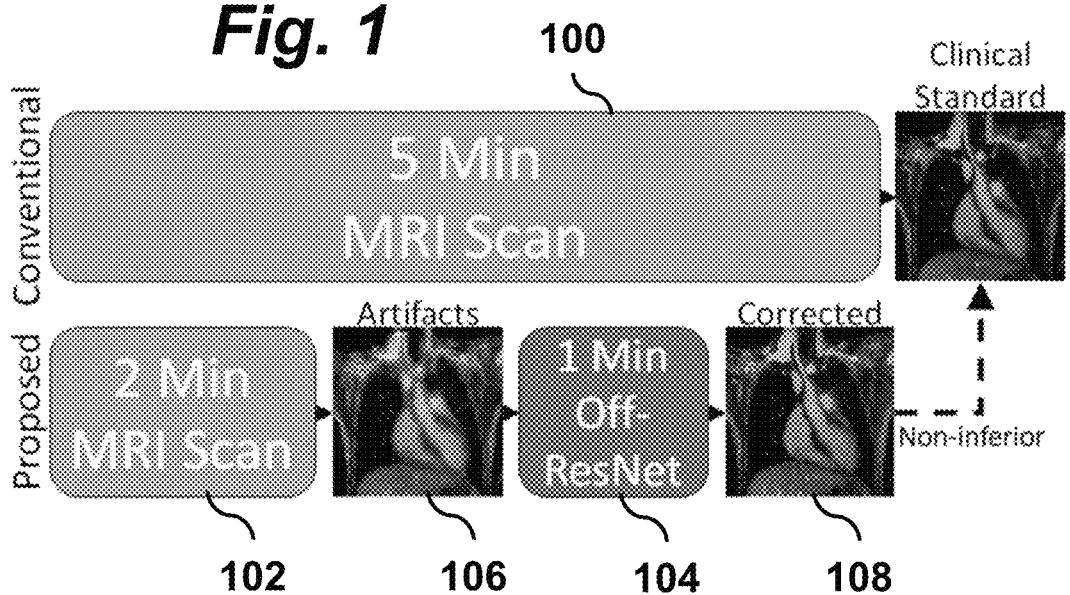
Fig. 1
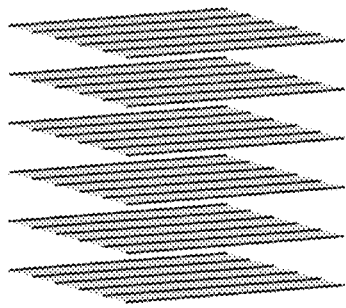
Fig. 2A
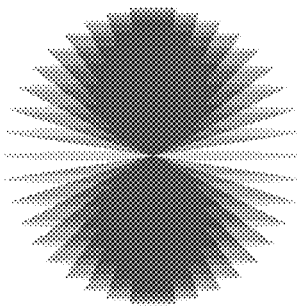
Fig. 2B
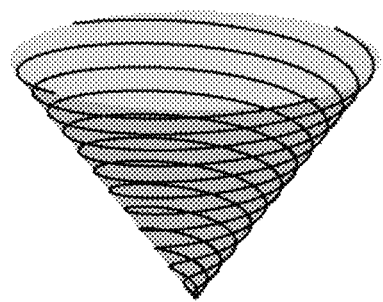
Fig. 2C
Fig. 4
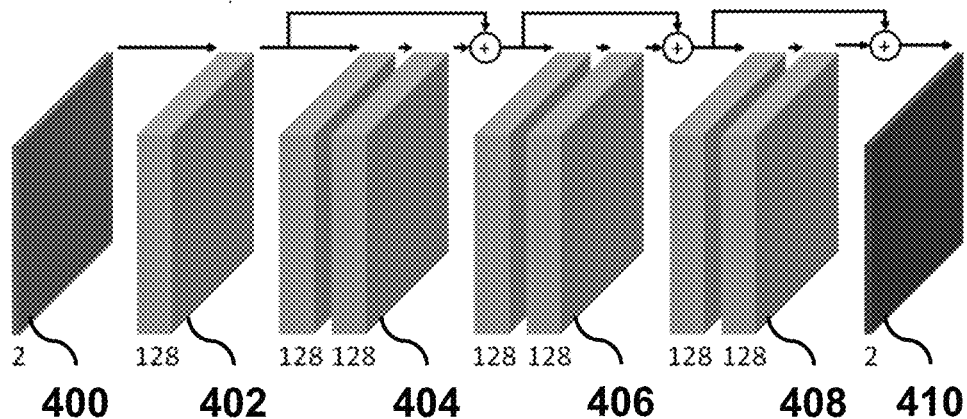

DEEP LEARNING METHOD FOR NONSTATIONARY IMAGE ARTIFACT CORRECTION

STATEMENT REGARDING FEDERALLY SPONSORED RESEARCH OR DEVELOPMENT

This invention was made with Government support under contracts HL127039 and EB009690 awarded by the National Institutes of Health. The Government has certain rights in the invention.

FIELD OF THE INVENTION

The present invention relates generally to techniques for magnetic resonance imaging. More specifically, it relates to techniques for correcting off-resonance imaging artifacts.

BACKGROUND OF THE INVENTION

Magnetic resonance imaging (MRI) is an important medical imaging modality for imaging soft tissue in the body and is important in clinical practice. However, MRI scans are slow and take several minutes to collect sufficient data to satisfy Shannon-Nyquist rates. This problem is especially acute for 3D images. Long scan times create patient discomfort and aversion to MRI. Long scan times also prevent a radiologist from repeating the scan while the patient is still in the scanner.

In MRI, the body is placed in a strong, spatially homogeneous, and time-invariant magnetic field $B_0$ created by a polarizing magnet. This magnetic field is briefly oscillated using RF transmit coils to excite the hydrogen nuclei, causing them to precess at the Larmor frequency $\omega = -\gamma B_0$, where $\gamma$ is the proton gyromagnetic ratio and $B_0 = |B_0|$. The Larmor frequency is also known as the resonant frequency. The excited hydrogen nucleii briefly produce an RF signal that is detected by RF receive coils before they relax and re-align with the primary field $B_0$.

Additionally, to provide spatial encoding of the signal, a smaller magnitude linearly varying magnetic field, referred to as a gradient field $G(t)$, is superimposed on the primary field $B_0$, resulting in an applied field $B_r(t) = B_0 + r \cdot G(t)$. When the receiver is tuned to the resonant frequency $\gamma B_0/2\pi$, the demodulated complex-valued signal detected by the receiver coils is given by $$\bar{s}(t) = \int_r M(r) e^{-i2\pi r \cdot k(t)} dr \qquad (1)$$

where $M(r)$ is the spatial density of spins and $$k(t) = \frac{\gamma}{2\pi} \int_0^t G(\tau) d\tau. \qquad (2)$$

Eq. 1 is identical to a 3D Fourier transform. Indeed, the collected signal can be interpreted as collecting Fourier coefficients of the object being imaged, and the image can be reconstructed by an inverse Fourier transform of the signal.

The signal decays over time so repeated excitations and signal readouts are used to sufficiently sample the Fourier domain according to the Nyquist-Shannon sampling theorem. Through manipulation of the magnetic gradients, arbitrary, smooth sampling trajectories through the Fourier domain can sample the data. For example, FIG. 2A is a schematic diagram of a traditional 3D Cartesian sampling pattern, FIG. 2B is a schematic diagram of a 3D cones sampling pattern, and FIG. 2C is a schematic diagram of multiple readouts for sufficient Nyquist-Shannon sampling of a single conical surface.

The most common trajectory is Cartesian (FIG. 2A), following a rectilinear path. Cartesian trajectories, however, are not scan-time-efficient because for each excitation, only one row is acquired. Furthermore, while the trajectory is navigating to each row, the signal is decaying.

For 3D sampling, a more scan-time efficient trajectory is 3D cones (FIG. 2B). 3D cones trajectories immediately start sampling and can readout data for longer because of the smoothness of acquiring data on a conical surface rather than the disjointedness of collecting on a Cartesian grid, covering more of the Fourier domain per readout. This reduces the total number of excitations required and thus the length of the scan.

The use of scanning trajectories such as 3D cones can reduce scanning time compared with traditional 3D Cartesian trajectories, but these require long readouts. To compensate, more samples are collected per readout, fewer readouts are needed, and total scan time is reduced. However, collecting more samples per readout introduces a non-stationary artifact known as an off-resonance artifact. The artifact is non-stationary because it is spatially varying. Artifacts from off-resonance appear as image blurring, signal dropout, and may even hallucinate artificial anatomical structures. So, only by correcting the off-resonance artifacts can scan time be reduced using efficient trajectories with longer readout times.

Off-resonance artifacts are the result of small spatial variability in magnetic susceptibility from different tissues and air, imperfect $B_0$ fields from the main magnet, and chemical shift. Consequently, $B_0$ is not perfectly spatially homogeneous. This $\Delta B_0(r)$ is on the order of hundreds of parts-per billion. This results in a difference between the assumed resonant frequency and the actual resonant frequency on the order of tens to hundreds of Hertz. Consequently, longer readout times increase the severity of the off-resonance artifacts. FIG. 3 shows the off-resonance blurring of the point spread function (PSF) for different severities of off-resonance frequencies and readout times. The left column 300 shows the radius in the Fourier domain for four readout times 1.2 ms, 2.4 ms, 3.6 ms, 4.8 ms of the 3D cones trajectory. The right three columns 302, 304, 306 show, for off-resonances 0 Hz, ±250 Hz, ±500 Hz, respectively, spatially-localized PSFs of the 3D cones trajectory for four readout lengths. Different off-resonances and readout times have different PSFs, leading to non-stationary blurring. Because the PSF is spatially varying, traditional Fourier filtering approaches with stationary convolution are insufficient.

A computational technique called autofocusing attempts to correct for off-resonance by simulating the collected data at a large range of off-resonant frequencies, and a $\Delta\omega_0(r)$ map is constructed. Using this map, the artifacts can be removed. However, this autofocusing technique can fail when off-resonance is large, or when the image is noisy. Furthermore, autofocusing is computationally complex and can require on the order of several hours to complete. Other approaches to correcting off-resonance artifacts have similar problems. Thus, effectively correcting off-resonance artifacts in a practical manner remains an unsolved problem.

BRIEF SUMMARY OF THE INVENTION

The present invention provides a method for correcting MRI off-resonance artifacts so that efficient scan trajectories with long readouts can be used to reduce scan time, without sacrificing image quality. The method uses a convolutional residual network to process an entire 3D image in under a minute, correcting for the non-stationary image artifacts. Tests of the method indicate that short scans corrected by the method are statistically non-inferior to images from long scans, allowing reduction in scan time by a factor of 2.46 without reducing image quality.

In one aspect, the invention provides a method for magnetic resonance imaging that corrects non-stationary off-resonance image artifacts. The method includes performing by a magnetic resonance imaging (MRI) apparatus an imaging acquisition using non-Cartesian trajectories within a field of view of the MRI apparatus; and processing by the MRI apparatus the imaging acquisitions to produce a final image from a corrected complex-valued image. The processing includes reconstructing a complex-valued image and using a convolutional neural network (CNN) to correct for non-stationary off-resonance artifacts in the complex-valued image, where an input to the CNN is the complex-valued image and an output of the CNN is the corrected complex-valued image.

The CNN is preferably a residual network with multiple residual layers, where the CNN preferably includes an input layer, followed by a 5×5×5 convolutional layer, followed by three consecutive residual layers, followed by an output layer, where each of the three consecutive residual layers comprises two 5×5×5 convolutional layers. Preferably an input layer of the residual network and an output layer of the residual network are complex-valued with the complex real and imaginary components split into two respective channels. The complex-valued image input may have a non-zero real component and a zero imaginary component. The complex-valued image output may have a non-zero real component and a zero imaginary component.

The processing preferably comprises subtracting a complex-valued global mean from the complex-valued image, and dividing the complex-valued image by a global standard deviation. The complex-valued image may be 2D or 3D. The non-Cartesian trajectory may be a 2D spiral trajectory, a 2D radial trajectory, a 3D cones trajectory, or a 3D radial trajectory. Preferably, performing the image acquisition includes using a gradient-echo sequence, a spoiled gradient-echo sequence, or a steady-state free precession sequence.

BRIEF DESCRIPTION OF THE SEVERAL VIEWS OF THE DRAWINGS

FIG. 1 contrasts a conventional scan with the scanning procedure of the present invention which produces a comparable quality image in significantly shorter time.

FIGS. 2A-C are schematic diagrams a traditional 3D Cartesian sampling pattern, a 3D cones sampling pattern, and multiple readouts for sufficient Nyquist-Shannon sampling of a single conical surface, respectively.

FIG. 4 shows the structure of the convolutional neural network (CNN) used in a preferred embodiment of the present invention to remove non-stationary artifacts from the MRI image.

DETAILED DESCRIPTION OF THE INVENTION

Figure 3:
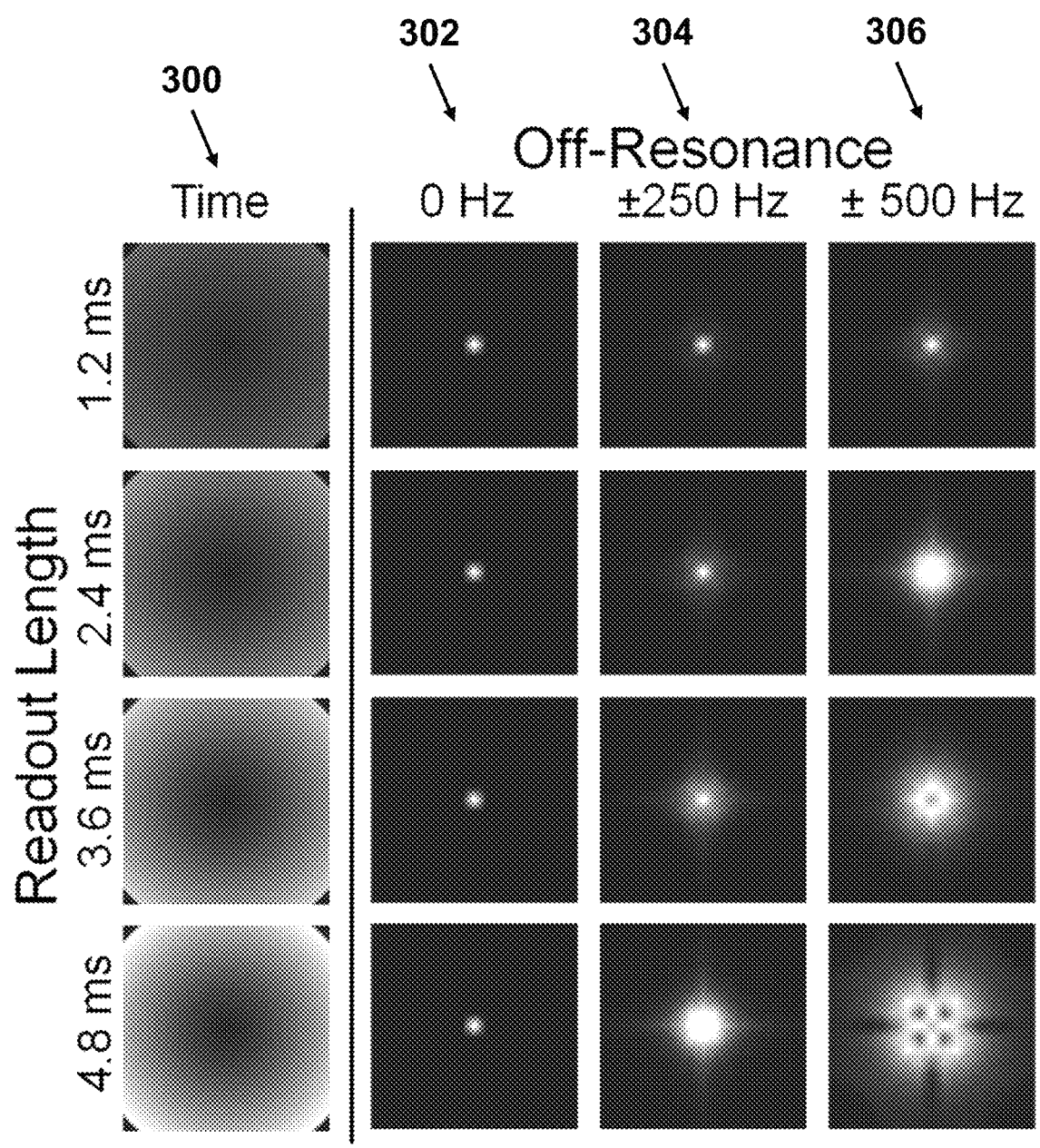
FIG. 3 shows the off-resonance blurring of the point spread function (PSF) for different severities of off-resonance frequencies and readout times.

Embodiments of the invention provide a method for MRI that includes correcting non-stationary off-resonance artifacts to allow for faster and more efficient 3D scans while maintaining image quality. FIG. 1 contrasts a conventional 5 minute scan 100 with the scanning procedure of the present invention which includes a 2 minute efficient scan 102, producing an image with artifacts, followed by a 1 minute off-resonance artifact removal processing step 104 to produce a comparable quality image in about ⅗ the time as the conventional method.

The imaging acquisition scan 102 is performed by a magnetic resonance imaging (MRI) apparatus using non-Cartesian trajectories (e.g., FIG. 2B or 2C). For example, the MRI apparatus may be a 3T GE scanner with a 32-channel body coil. The non-Cartesian trajectories may be a ferumoxytol-enhanced, spoiled gradient-echo 3D cones trajectory with short readouts between 0.9-1.5 ms, intended for diagnostic reading. The MRI apparatus reconstructs a complex-valued image 106 from the imaging acquisitions. For example, the data may be reconstructed with ESPIRiT and no motion correction. The reconstructed image 106 typically contains off-resonance non-stationary artifacts. A significant feature of the method is that rather than using an analytical approach for artifact removal, embodiments of the present invention use a data-driven approach. Specifically, the artifact removal processing step 104 uses a convolutional neural network (CNN) to correct for the non-stationary off-resonance artifacts in the complex-valued image 106 to produce a corrected complex-valued image 108.

FIG. 4 shows the structure of the convolutional neural network (CNN) used in a preferred embodiment of the present invention to remove non-stationary artifacts from the MRI image. The CNN is a residual network with multiple residual layers. The input and output to the CNN are 3D images with complex (i.e., real and imaginary) components as two separate channels.

The CNN preferably includes a two-channel input layer 400, followed by a 128-channel 5×5×5 convolutional layer 402, followed by three consecutive residual layers 404, 406, 408, followed by an output layer 410. Each of the three consecutive residual layers 404, 406, 408 has two 128-channel 5×5×5 convolutional layers.

The network used is entirely convolutional so it can accept any size 3D input. The first layer 400 convolves the input to the necessary residual layer size. The output layer 410 produces the corrected 3D target image with two channels corresponding to real and imaginary components.

In a pre-processing step prior to entering the first layer of the CNN, the complex 3D image input with its real and imaginary components is split apart into two channels to produce a 4D image volume. The 4D image volume has its global mean subtracted and is then divided by its global standard deviation.

The preprocessed image enters the first layer 400 which pads a singular channel as the first dimension to form a 5D image volume. The 5D image volume is 3D convolved once by the 5×5×5 filter 402 to 128 channels. This is fed into the multiple consecutive residual layers 404, 406, 408. The final layer 410 reduces the image to 2 channels, corresponding to the real and imaginary components, for output.

Although this residual network architecture is preferred, other architectures are also contemplated. For example, the network could be made deeper with additional residual layers. The network could also use a fully connected dense residual architecture. A generative adversarial network could also be used with the network. The current suggestions for variations of the network would augment the network as a generator. Another convolutional neural network would take in the input of the generator and be the discriminator network. The discriminator convolutional neural network could be a subset of the architecture necessary for a fully connected dense residual neural network.

Network performance could also potentially be improved by adjusting the cost functions and regularizations. As new deep learning methods are developed, state-of-the-art techniques are directly translatable for our application. In addition to performing the correction, a network can be designed to map parameters of the non-stationary kernel. For instance, a network can output the degree of off-resonance. This information can then be used to correct using a more conventional approach. Further, this map (or a separately measured map) can be included as an input to assist the deep neural network that performs the correction.

In a preferred embodiment, the CNN may be trained as follows. Training data was acquired on a 3T GE scanner with contrast-enhanced with a 32-channel body coil and a ferumoxytol-enhanced, spoiled gradient-echo 3D cones trajectory.

A set of reference images for training were obtained with long readout lengths between 2.8-3.8 ms with a 3.3 ms mean. Another set of images for validation and testing was obtained with short readout lengths between 0.9-1.5 ms with a 1.1 ms mean. The average scan times for the short-readout and long-readout images were 5.38 and 2.19 minutes, respectively. Thus, the long readouts on average led to a shorter scan by a factor of 2.46. All scans in both sets were reconstructed with ESPIRiT and no motion correction.

Each short-readout scan was corrected with multifrequency autofocusing to correct off-resonance artifacts, creating a nominally on-resonance image. These corrected images were used in training as the reference images for supervised learning.

Training input data was generated from the reference data by computationally augmenting the reference images with simulated zero-order off-resonance artifacts, implemented by incorporating an off-resonance factor $e^{it\Delta\Omega_{0_r}}$ into Eq. 1. The reference images were simulated at multiple off-resonance frequencies between −500 and 500 Hz. Additionally, the off-resonance was applied across four different 3D cones trajectories with 1.2, 2.4, 3.6, 4.8 ms readout lengths to simulate a greater diversity of off-resonance artifacts.

For training, each dataset was divided into overlapping 64×64×64 voxel patches. This was done to further augment data and for fitting data onto GPU memory. Training was performed using TensorFlow with an $L_1$-loss cost function. Normal clinical datasets are around 420×420×120 voxels.

Figure 5:
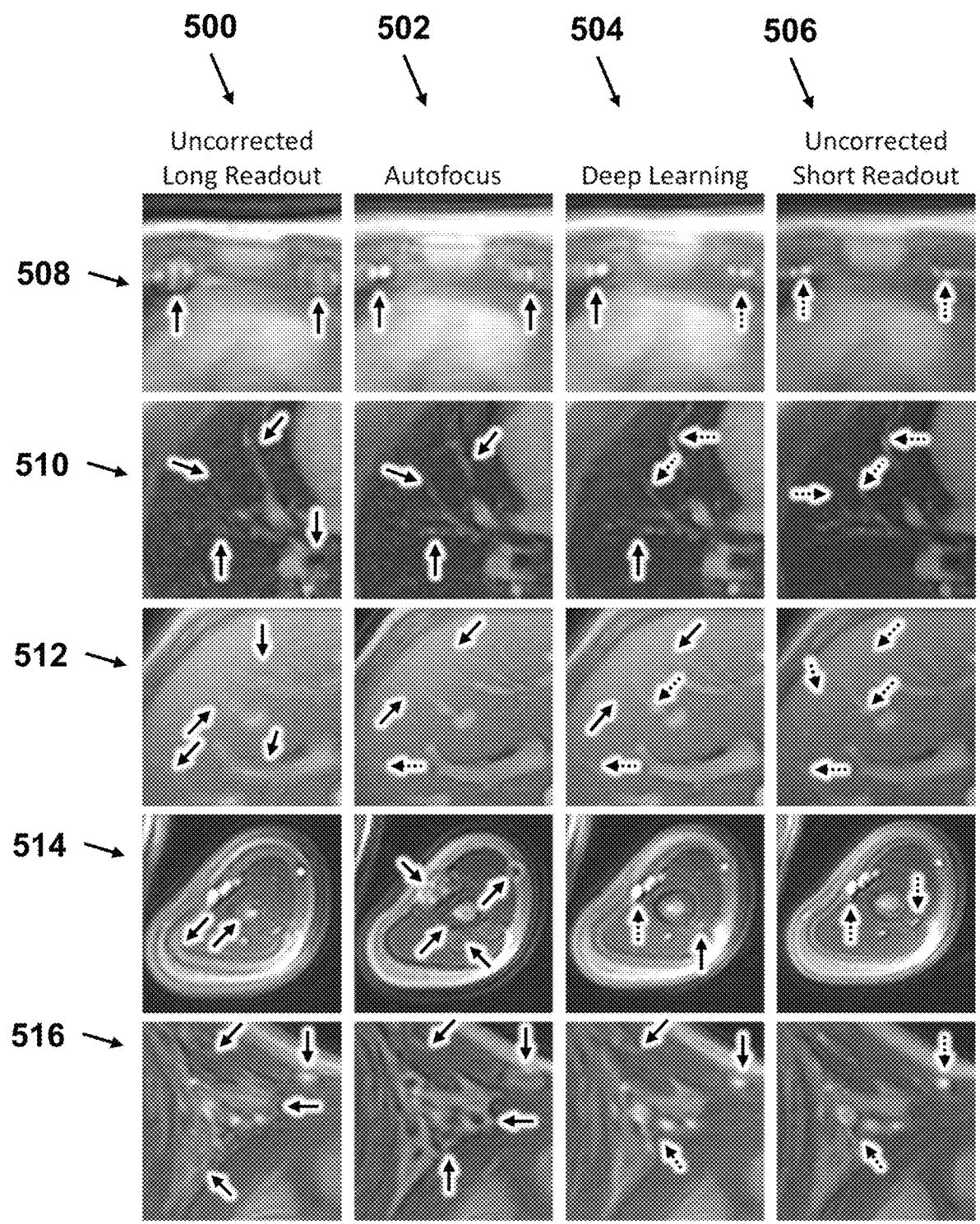
FIG. 5 is an image grid comparing sample images from five different anatomical regions, comparing uncorrected long readout, long readout with autofocus correction, long readout with deep learning correction, and uncorrected short read-out images for each region.

FIG. 5 is an image grid comparing sample images of four different types for five different anatomical regions. The four columns 500, 502, 504, 506, show images in the following four categories, respectively: uncorrected long readout 500, long readout with autofocus correction 502, long readout with deep learning correction 504, and uncorrected short readout 506. The five rows 508, 510, 512, 514, 516 show the following anatomical regions, respectively: internal mammary arteries 508, sub-segmental right pulmonary arteries 510, hepatic and portal veins 512, upper arm 514, and axillary vessels 516.

Off-resonance blurring is most visible in the loss of sharpness in the vessels, as highlighted by the solid arrows. Good vessel definition is highlighted by the dotted arrows. The blood vessels in the uncorrected long-readout images 500 are severely blurred. In some images, it is apparent that the blood vessels have lost sharpness in the uncorrected long-readout image, to the point that they are undistinguishable from the surrounding tissue as noise.

Autofocus corrected images 502 show recovery of some sharpness of the blood vessels, but the vessels are still noisy. Images 504 corrected with deep learning by the residual network show recovered greater sharpness in the vessels and even the small vessels branching out are visible. Rows 514 and 516 show regions where autofocus corrected images 502 remain blurry while deep learning corrected images 504 have recovered sharpness.

The deep learning corrected images 504 show similar quality as the reference image from the uncorrected short-readout image 506. For all datasets, the residual network deep learning technique required less than a minute to compute the results on an Nvidia Titan Xp.

Figure 6A:
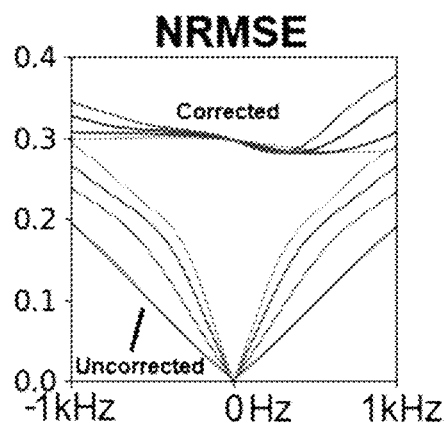
FIG. 6A-C are plots using three different image quality metrics, each comparing uncorrected images with images corrected using the techniques of the present invention.
Figure 6B:
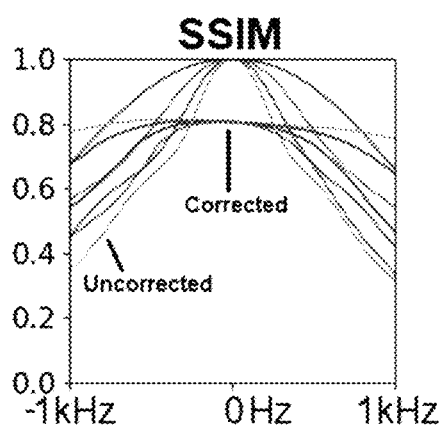
Figure 6C:
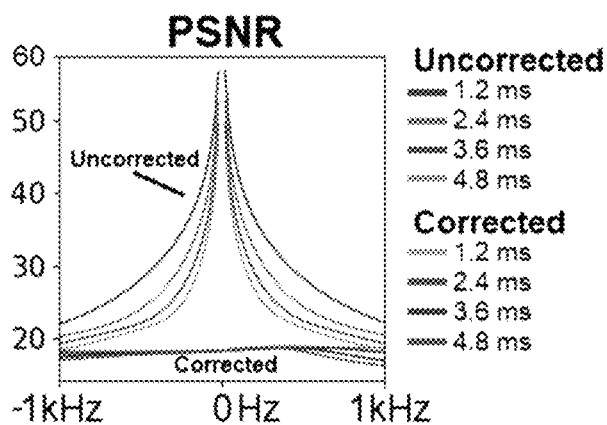

To evaluate performance of the deep learning correction as a function of off-resonance, several image quality metrics were calculated comparing off-resonance augmented reference (uncorrected) images with images corrected by our deep learning technique. FIG. 6A shows a comparison using normalized root-mean-square error (NRMSE), FIG. 6B shows a comparison using structural similarity index (SSIM), and FIG. 6C shows a comparison using peak signal-to-noise ratio (PSNR). Each graph shows the quality metric as a function of off-resonance for corrected and uncorrected images and several readout lengths. The metrics were interpreted relative to performance at 0 Hz (on-resonance) rather than the absolute values because the reference image is not a true gold standard image.

From the NRMSE plot of FIG. 6A, we can see that the reference image with added off-resonance has monotonically increasing error as a function of off-resonance, which is expected. The NRMSE for the deep-learning images also increases as off-resonance increases but at a slower rate. The shorter readouts of 1.2 ms and 2.4 ms are almost constant across this range showing that the method is able to correct for these off-resonances. The longer readouts of 3.6 ms and 4.8 ms begin to rapidly worsen at around ±500 Hz, suggesting that the network performs best in the range of trained off-resonances but can still have a benefit for larger off-resonances.

For the SSIM plot of FIG. 6B, the reference image with added off-resonance has worse performance as off-resonance increases. The deep-learning correction shows noticeable concavity as well. There is a relatively flat regime centered around small off-resonances before the metric begins to significantly decay at about ±500 Hz. It should be noted that the decay rate is progressively worse as readout length increases. For readout lengths of 4.8 ms, the decay rate appears to be equal to that of the reference image with added off-resonance. Conversely, from this plot, an acceptance window of off-resonances versus readout length could be constructed to indicate acceptable deep learning correction performance in conjunction with the NRSME plot.

For the PSNR plot of FIG. 6C, the reference image decreases as more off-resonance is added. However, the PSNR for the deep-learning correction stays nearly constant across the whole range. This might suggest that PSNR is unable to capture image quality loss from off-resonance artifacts.

Figure 7:
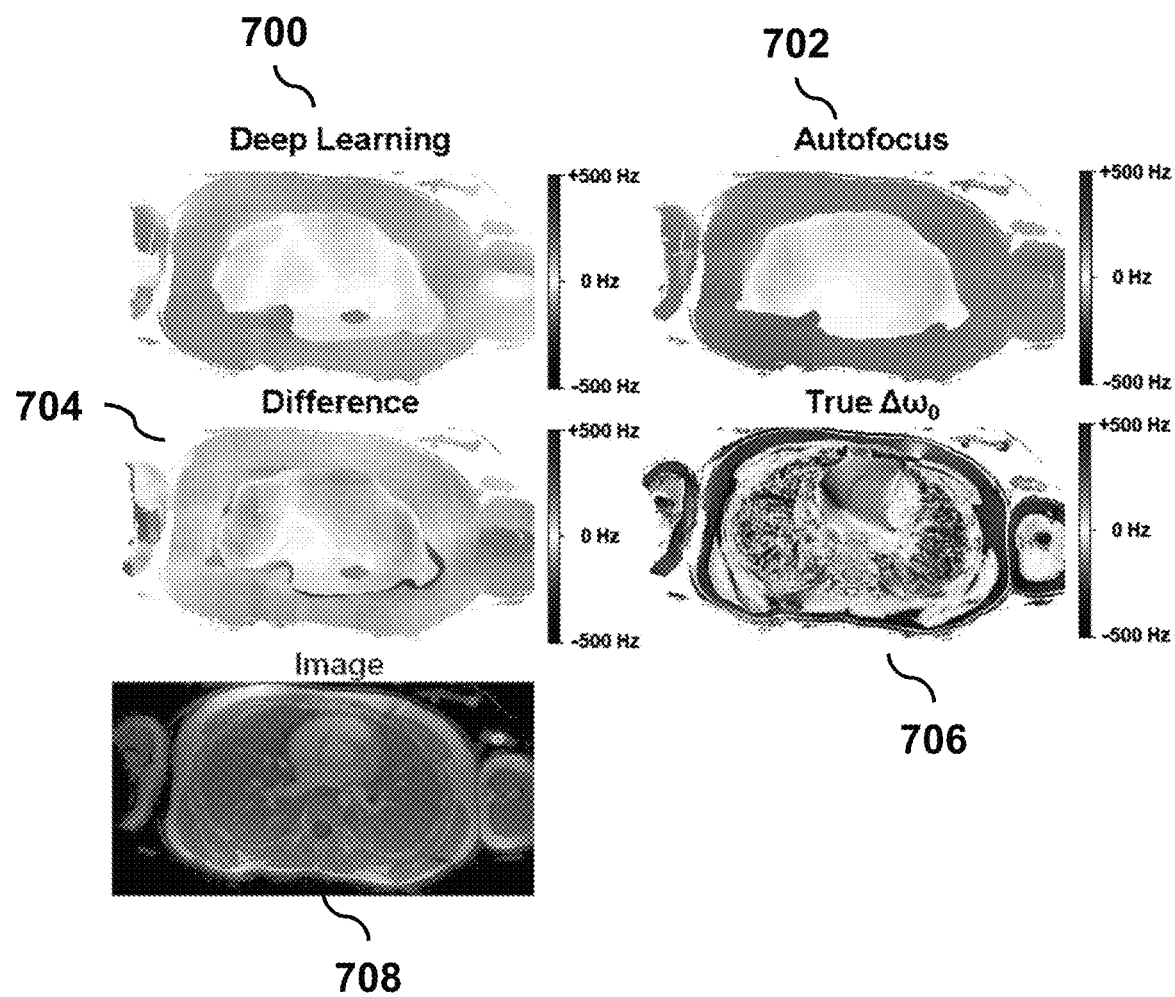
FIG. 7 shows field maps comparing deep-learning-corrected images and conventional autofocus-corrected images, as well as a difference map and true off-resonance map.

To visualize the effects of the deep-learning correction, $\Delta\omega_0$ maps were calculated by applying off-resonance to the original image and finding the closest match with the autofocus metric. FIG. 7 shows field maps of the deep-learning-corrected images 700 and autofocus-corrected images 702 that were generated by applying off-resonance to the original image 708 and finding the closest match with the autofocus metric. The difference map 704 shows that the two estimates in 700 and 702 are similar, giving confidence that the deep-learning approach is not hallucinating structures. As another check, 700 and 702 are low-resolution versions of the true off-resonance map 706.

These computational metrics suggest that the best performance of the network is within the trained range of ±500 Hz and performance begins to decrease outside this range. Inspecting the true $\Delta\omega_0$ map in FIG. 7D, we see that the actual distribution of in vivo off-resonances fits comfortably within this range of good performance.

The deep learning artifact correction method produces images non-inferior to diagnostically-useful images while having a 2.46× shorter scan. The deep learning images are also non-inferior to autofocus images and superior in several cases even though the CNN was trained on images corrected by autofocus. Although autofocus may not always resolve all off-resonance artifacts, perhaps statistically across all images, autofocus works well and the neural network is learning the appropriate corrections.

Autofocus is computationally intensive because each candidate frequency must be simulated and reconstructed. In contrast, the deep learning technique can correct an image in a single pass. A typical dataset requires under a minute to be corrected with the CNN, fast enough to be viable for clinical workflow. This is important to radiologists in the clinic because they can promptly review the images while the patient is still in the scanner to repeat the scan if image quality is poor or to immediately prescribe a new scan to investigate suspicious areas. Slow reconstruction limits the ability to perform diagnostics and could delay critical clinical decisions.

Faster scans also allow for greater temporal resolution. The techniques of the present invention can be extended to 2D real-time imaging to visualize the dynamics of the heart, the tongue and throat for speech, and for MRI-guided surgery. This could lead to better diagnostic quality and greater understanding of human biomechanics.

Adding additional capacity to the model through addition of more layers may increase performance. Alternatively, using a supervised generative adversarial network (GAN) may also increase performance because GANs have been demonstrated to increase perceptual appeal of natural images.

For training, the reference image was a short-readout image corrected with autofocus. However, autofocus is an imperfect correction technique and perhaps performance could also be improved with off-resonance correction using true $\Delta\omega_0$ maps such as in FIG. 7D, at the cost of increasing the complexity of acquiring a training dataset. A similar idea could be to train a model to regress the $\Delta\omega_0$ map and then use a forward physical model to correct for off-resonance.

The invention claimed is:

1. A method for magnetic resonance imaging that corrects non-stationary off-resonance image artifacts, the method comprising:

(a) performing by a magnetic resonance imaging (MRI) apparatus an MRI imaging acquisition using non-Cartesian trajectories within a field of view of the MRI apparatus to produce imaging data acquired using the non-Cartesian trajectories; and (b) processing by the MRI apparatus the imaging data acquired using the non-Cartesian trajectories to produce a final MRI image; wherein the processing comprises:
  i. reconstructing from the imaging data acquired using the non-Cartesian trajectories a complex-valued MRI image and
  ii. using a convolutional neural network (CNN) to correct for non-stationary off-resonance artifacts in the complex-valued MRI image to produce the corrected complex-valued MRI image,
    wherein an input to the CNN is the complex-valued MRI image and an output of the CNN is the corrected complex-valued MRI image;
  iii. wherein the CNN is trained using a set of training MRI images comprising reference MRI images with off-resonance artifacts corrected using multifrequency autofocusing and input data generated by augmenting the reference MRI images with simulated zero-order off-resonance artifacts.

2. A method for magnetic resonance imaging (MRI) that corrects non-stationary off-resonance image artifacts, the method comprising:

(a) training a convolutional neural network (CNN) using a set of training MRI images, wherein the set of training MRI images comprises reference MRI images with off-resonance artifacts corrected using multifrequency autofocusing, and input data generated by augmenting the reference MRI images with simulated zero-order off-resonance artifacts;

(b) performing by a magnetic resonance imaging (MRI) apparatus an MRI imaging acquisition using non-Cartesian trajectories within a field of view of the MRI apparatus to produce imaging data acquired using the non-Cartesian trajectories;

(c) reconstructing by the MRI apparatus a complex-valued MRI image from the imaging data acquired using the non-Cartesian trajectories, and (d) correcting non-stationary off-resonance artifacts in the complex-valued MRI image to produce a corrected complex-valued MRI image by inputting the complex-valued MRI image into the convolutional neural network (CNN) and obtaining the corrected complex-valued MRI image as an output of the CNN.

3. The method of claim 1 wherein the CNN is a residual network with multiple residual layers.

4. The method of claim 3 wherein the CNN comprises an input layer, followed by a 5×5×5 convolutional layer, followed by three consecutive residual layers, followed by an output layer, where each of the three consecutive residual layers comprises two 5×5×5 convolutional layers.

5. The method of claim 3 wherein an input layer of the residual network and an output layer of the residual network are complex-valued with the complex real and imaginary components split into two respective channels.

6. The method of claim 1 wherein the complex-valued MRI image input to the CNN has a non-zero real component and a zero imaginary component.

7. The method of claim 1 wherein the corrected complex-valued MRI image output of the CNN has a non-zero real component and a zero imaginary component.

8. The method of claim 1 wherein the processing comprises subtracting a complex-valued global mean from the complex-valued MRI image, and dividing the complex-valued MRI image by a global standard deviation.

9. The method of claim 1 wherein the complex-valued MRI image is 2D.

10. The method of claim 1 wherein the complex-valued MRI image is 3D.

11. The method of claim 1 wherein the non-Cartesian trajectory is a 2D spiral trajectory, a 2D radial trajectory, a 3D cones trajectory, or a 3D radial trajectory.

12. The method of claim 1 wherein performing the MRI imaging acquisition comprises using a gradient-echo sequence, a spoiled gradient-echo sequence, or a steady-state free precession sequence.

* * * * *